June 9, 1953

W. H. E. SAMUELSON

METHOD OF MOUNTING THICKNESS SHEAR MODE QUARTZ CRYSTAL OSCILLATOR PLATES

Filed April 20, 1949

2,641,718

INVENTOR.

Wallace H. E. Samuelson

BY

John B. Brady

ATTORNEY

Patented June 9, 1953 2,641,718

UNITED STATES PATENT OFFICE 2,641,718

METHOD OF MOUNTING THICKNESS SHEAR MODE QUARTZ CRYSTAL OSCILLATOR PLATES

Wallace H. E. Samuelson, Carlisle, Pa., assignor to Selectronics, Inc., Carlisle, Pa., a corporation of Pennsylvania Application April 20, 1949, Serial No. 88,554

9 Claims. (Cl. 310—9.4)

Figures 1, 2, 3, 4, 5, 6, 7:
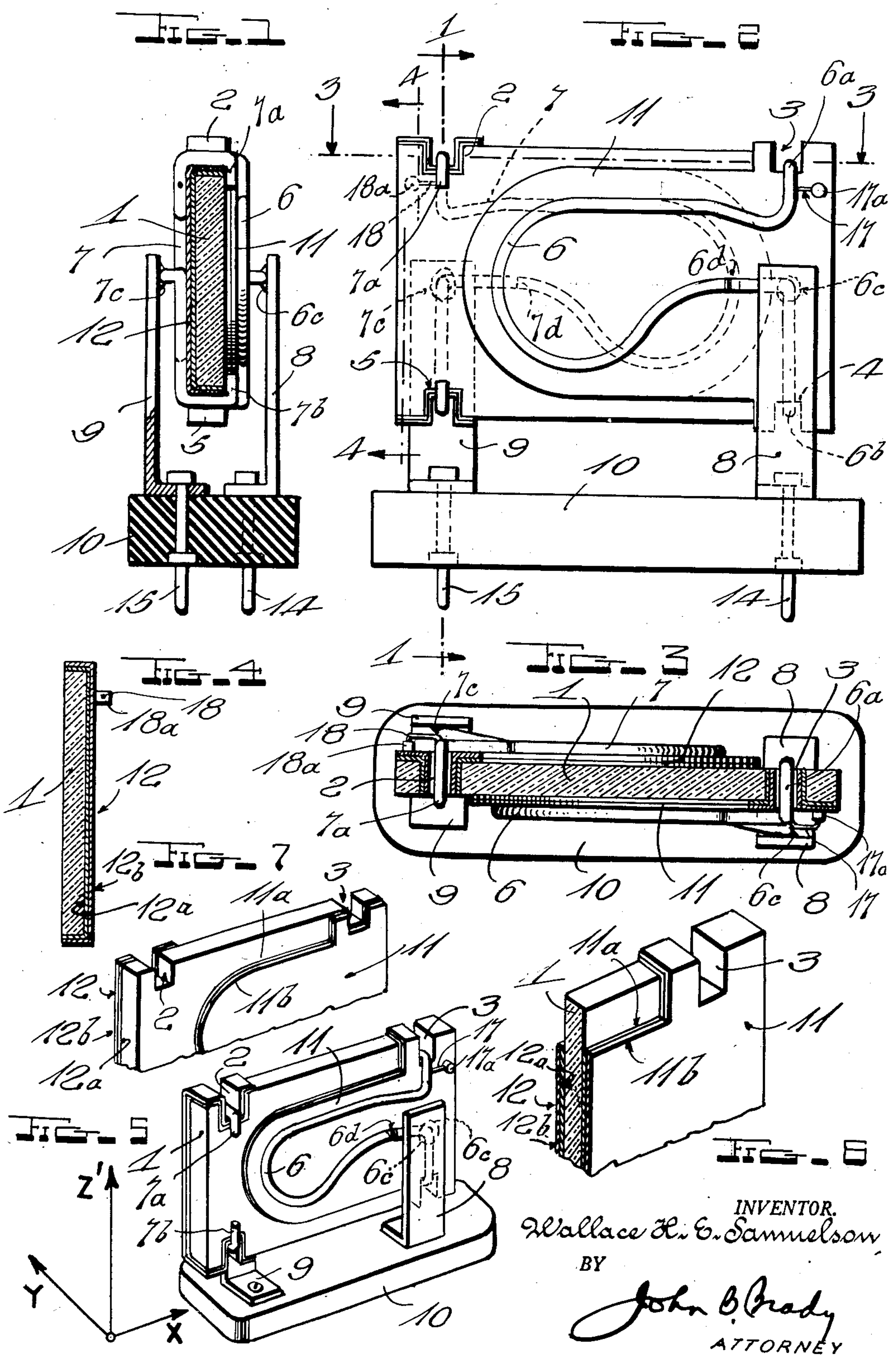

My invention relates broadly to piezoelectric crystals, and more particularly to a method and structural arrangement for mounting piezoelectric crystals for operation at low frequencies.

One of the objects of my invention is to provide a method of mounting piezoelectric crystals for operation at high efficiency over low frequency ranges of the order of 3000 kc. and 700 kc. and possibly lower.

Another object of my invention is to provide a method of cutting quartz crystal plates with prearranged notches, which facilitate mounting of the crystal for operation at high efficiency at low frequency ranges.

Still another object of my invention is to provide a construction of quartz crystal plate of the AT-cut type with its edges sensibly parallel to the X and Z′ axes, and having spaced notches so positioned that a line connecting the corresponding notches on opposite edges is parallel to the Z′ axis.

A further object of my invention is to provide a structural arrangement for mounting AT-cut quartz plates with the edges of the plate sensibly parallel to the X and Z′ axes having minimal moment of inertia mounting and inhibition of normal displacement due to a bending mode, in which compressive spring means are provided, including an arrangement of compressive springs establishing electrical connection with opposite faces of the quartz plate, and wherein compressive spring forces are applied in a direction parallel to the Z′ axis for restraining the quartz plate from oscillation in the unwanted face shear mode oscillation, while utilizing the quartz plate for oscillation at maximum efficiency over a low frequency range.

Other and further objects of my invention reside in a method and structural arrangement for operating piezoelectric quartz plates at low frequencies, as set forth more fully in the specification hereinafter following, by reference to the accompanying drawings, in which:

Figure 1 is a vertical sectional view through a low frequency piezoelectric crystal, and mounting means therefor, in accordance with my invention, the view being taken substantially on line 1—1 of Fig. 2; Fig. 2 is a front elevational view of the low frequency piezoelectric crystal and mounting assembly, in accordance with my invention; Fig. 3 is a top plan view of the low frequency piezoelectric crystal and mounting means illustrated in Fig. 2; Fig. 4 is a vertical sectional view taken substantially on line 4—4 of Fig. 2; Fig. 5 is a perspective view of the low frequency piezoelectric crystal and mounting means therefor embodying my invention; Fig. 6 is a fragmentary portion of the piezoelectric plate on an enlarged scale showing the manner of notching the corner edge thereof; and Fig. 7 is a fragmentary portion of a piezoelectric plate prepared in accordance with my invention, the plating within the notches being omitted.

My invention is directed to a new method of mounting thickness shear mode quartz crystal oscillator plates. In the present state of the art, such crystal oscillator plates below the frequency of 2500 kc. have to be "space mounted," by which method the crystal floats between flat metal electrodes, or else the electrodes are plated on the surface of the quartz, in which chase also the oscillator plate is not constrained. These free floating oscillator plates are subject to many disadvantages, such as the fact that they cannot undergo severe or sustained vibration. Substantial variation in activity and in frequency is experienced. Such blanks are subject to breakage, since they are free to move about, etc. The present invention provides means for mounting the oscillator plate so that it is free to oscillate, but at the same time is constrained, so that the disadvantages hereinbefore mentioned are eliminated.

This method of mounting is feasible between the frequency range of 3000 kc. and 700 kc. and lower, and has the further advantage of being extremely compact, so that a small, light, frequency control unit can be made by employing this method of mounting.

The piezoelectric crystal comprises a blank formed from a quartz plate indicated by reference character 1, constituting an AT-cut substantially rectangular plate with its edges sensibly parallel to the X and Z′ axis. The plate 1 is provided with notches 2, 3, 4 and 5 placed such that the line connecting the corresponding notches on opposite edges is parallel to the Z′ axis. Notching in this manner does not inhibit the desired thickness shear mode of oscillation. The compressive spring force is applied in a direction parallel to the Z′ axis by a pair of spring wires as shown at 6 and 7 supported on upright lugs 8 and 9 carried by base 10 of insulation material. Clamping in this manner restrains the plate from oscillating in the unwanted face shear mode of oscillation. It has been found undesirable to notch the edges of the crystal which are normal to the X axis, since the mere act of notching these edges reacts unfavorably on the thickness shear mode, reducing activity considerably, and clamping with the compressive spring force parallel to the X axis completely dampens out the thickness shear mode. The quartz plate has metallic electrodes 11 and 12 deposited on the major faces and within the notches in a pattern which insulates the major faces from each other and yet allows electrical contact to be made to the faces by the supporting springs. The metal, in this specific instance, has been sputtered gold, represented by layer 11a and 12a. Over the base plate of gold 11a and 12a is laid an electroplated film of nickel 11b and 12b which is varied in thickness to control the final frequency of the oscillator unit. Contact is made to these plated electrodes through the support springs 6 and 7, which serve the dual purpose of mechanically holding the plate and electrically connecting to the surfaces with the holder pins 14 and 15, carried by base 10. Since mechanical contacts are subject to corrosion and wear due to vibration, it is feasible and has been shown practicable to solder one end of a fine wire 17 and 18 to the plates surfaces 11 and 12, respectively, of the quartz at 17a and 18a, and the other to the supporting spring at 6 and 7. In such cases, the surfaces within the notches may or may not be plated. I have illustrated in Figs. 1 to 6 the condition when the notches are plated, and in Fig. 7 the condition when plating is omitted from the notches. This provides a continuous soldered electrical path from the holder pin to the crystal electrode with no electrical contacts depending upon mechanical joints.

The spring material 6 and 7 may be any satisfactory metal, such as steel, beryllium copper, or phosphor bronze. Each spring is shaped in the form of a central loop with an outwardly extending resilient portion indicated at 6d and 7d that is soldered at 6c and 7c to the upright lugs 8 and 9, respectively. All of these have proven satisfactory. The design of the spring is such to provide a compressive clamping force in a direction parallel to the Z′ axis. The hooks 6a, 6b and 7a and 7b on the ends of the springs extend through the slots 2, 3, 4 and 5 and prevent the crystal 1 from moving in a direction normal to its major plane. The lower hooks 6b and 7b of the spring structure are mounted rather rigidly to the upright lugs and when the springs are seated in the notches there is no motion of the quartz in a direction parallel to the X axis. The clamping action of the springs prevents motion in a direction parallel to the Z′ axis.

The compressive force of the springs can vary within wide limits without materially affecting the frequency or activity of the blank. The minimum force is determined by mechanical considerations necessary to hold the crystal firmly in place. The springs are mounted at the top of the stiffening upright lugs 8 and 9 to provide effective mounting points on a horizontal center line through the quartz plate about which the quartz plate has a minimum moment of inertia. This reduces the amplitude of vibration of the plate during physical shocks.

The crystal mounting is extremely compact by reason of the fact that the supporting feet on the upright lugs 8 and 9 extend toward the crystal. That is, the supporting feet are turned so that they are located beneath the thickness dimension of the crystal. The upright lugs 8 and 9 are L-shaped, with the lower ends of the L supported on the base of insulation material 10.

Throughout the several views the plating has been shown in exaggerated thickness in order to clearly bring out the invention. Moreover, it will be understood that the portions of the plating which are undesired may be removed by grinding, etching, or otherwise eliminating the plating in the undesired areas.

For purposes of explaining one embodiment of my invention, I refer herein to the dimensions of a crystal mounting that has proven particularly effective, that is an AT-cut crystal with parameters ZZ′ 34° 35′±15′, XX′±15′, 3rd angle ±15′; dimension parallel to X axis .573″±.002″; dimension parallel to Z′ axis .503″±.001″; dimension parallel to the Y′ axis of approximately .0665″. Blank finished in 600 carborundum with a double convexity symmetrically disposed and of a magnitude of .00005″. At 1000 kc. the crystal frequency was reduced approximately 3 kc. by the combination of gold sputtering and electro-plated nickel.

The supporting feet or lugs were constructed of .020″ beryllium copper strip. The notches were nominally .030″ wide, .020″ deep, and .100″ from the edge which is parallel to the Z′ axis.

The springs were formed of .020″ diameter beryllium copper. Contact was made from the supporting springs to the crystal electrodes by soldering a .002″ diameter coined silver wire, using a tin-silver eutectic solder.

Oscillating the crystal in a test set at a range in temperature from −55 C. ° to 90 C. ° produced an activity variation indicated by a rectified grid current of .55 ma.±10% and a frequency reading of 1000 kc.±<.008%.

The unit resisted drop and vibration tests with nominal frequency and activity changes.

I have found the mounting of my invention highly practical and efficient in operation, and while I have described my invention in certain of its preferred forms, I realize that modifications may be made and I desire that it be understood that no limitations upon my invention are intended other than may be imposed by the scope of the appended claims.

What I claim as new and desire to secure by Letters Patent of the United States is as follows:

1. A piezoelectric crystal system comprising a quartz crystal plate of the AT-cut type, having X, Y and Z′ axes with its edges sensibly parallel to the X and Z′ axes and having spaced notches so posiitoned that a line connecting the corresponding notches on opposite edges is parallel to the Z′ axis, a minimal moment of inertia mounting for said plate having inhibition of normal displacement due to a bending mode comprising compressive spring means establishing electrical connection with opposite faces of the quartz plate and terminating in hooks engaging the notches in the plate, and means for supporting and providing electrical connection to said compressive spring means.

2. A piezoelectric crystal system comprising a quartz crystal plate of the AT-cut type, having X, Y and Z′ axes with its edges sensibly parallel to the X and Z′ axes and having spaced notches so positioned that a line connecting the corresponding notches on opposite edges is parallel to the Z′ axis, a minimal moment of inertia mounting for said plate having inhibition of normal displacement due to a bending mode comprising compressive spring means establishing electrical connection with opposite faces of the quartz plate and terminating in hooks engaging the notches in the plate, means engaging said compressive spring means at points substantially in a line passing through the horizontal center line of said quartz crystal plate and electrical terminals insulatingly supported with respect to each other and connected with said last mentioned means.

3. A piezoelectric crystal system comprising a quartz crystal plate of the AT-cut type, having X, Y and Z′ axes with its edges sensibly parallel to the X and Z′ axes and having spaced notches so positioned that a line connecting the corresponding notches on opposite edges is parallel to the Z′ axis, a minimal moment of inertia mounting for said plate having inhibition of normal displacement due to a bending mode comprising compressive spring means establishing electrical connection with opposite faces of the quartz plate and terminating in hooks engaging the notches in the plate, means fastened to said compressive spring means along an axis about which the crystal plate has a minimum moment of inertia, and means for insulatingly mounting said last mentioned means for insulatingly supporting said compressive spring means.

4. A piezoelectric crystal system comprising a quartz crystal plate of the AT-cut type, having X, Y and Z′ axes with its edges sensibly parallel to the X and Z′ axes and having spaced notches so positioned that a line connecting the corresponding notches on opposite edges is parallel to the Z′ axis, a minimal moment of inertia mounting for said plate having inhibition of normal displacement due to a bending mode comprising compressive spring means establishing electrical connection with opposite faces of the quartz plate and terminating in hooks engaging the notches in the plate, metallic angle members, a base of insulation material supporting said metallic angle members in spaced insulated relation, electrical terminals connected with the lower ends of said angle members and connections between said compressive spring means and the upper ends of said angle members along a line substantially coincident with the horizontal center line of the quartz crystal plate.

5. A piezoelectric crystal system comprising a quartz crystal plate of the AT-cut type having X, Y and Z′ axes with its edges sensibly parallel to the X and Z′ axes with notches adjacent the opposite edges thereof so positioned that a line connecting the corresponding notches on opposite edges is parallel to the Z′ axis, a minimal moment of inertia mounting for said plate having inhibition of normal displacement due to a bending mode comprising compressive spring members in the form of loops terminating in hooks at the ends thereof with the hooks of one spring member engaged over the notches adjacent one end of the plate, and the hooks of the other spring member engaged over the notches at the other end of the plate, the loops of said spring members exerting clamping forces against opposite faces of the plate in a direction parallel to the Z′ axis, and means insulatingly supporting said spring members in a line substantially coincident with a line through the horizontal center line of the plate.

6. A piezoelectric crystal system comprising a quartz crystal plate of the AT-cut type having X, Y and Z′ axes with its edges sensibly parallel to the X and Z′ axes, with notches adjacent the opposite edges thereof so positioned that a line connecting the corresponding notches on opposite edges is parallel to the Z′ axis, a metallic coating formed on the opposite faces of said crystal plate, a minimal moment of inertia mounting for said plate having inhibition of normal displacement due to a bending mode comprising compressive spring members in the form of loops terminating in hooks at the ends thereof with the hooks of one spring member engaged over the notches adjacent one end of the plate, and the hooks of the other spring member engaged over the notches at the other end of the plate, the loops of said members exerting clamping forces against the metallic coatings on the opposite faces of the plate in a direction parallel to the Z′ axis, means insulatingly supporting said spring members in a line substantially coincident with a line through the horizontal center line of the plate, and a yieldable electrical connection extending between the metallic coating and the spring member which presses thereagainst.

7. A piezoelectric crystal system comprising a quartz crystal plate of the AT-cut type having X, Y and Z′ axes with its edges sensibly parallel to the X and Z′ axes, a support of insulation material, means having a minimal moment of inertia for clamping said crystal plate and establishing electrical connection with opposite faces of the plate by compressive forces in a direction parallel to the Z′ axis and preventing the plate from being displaced in a direction normal to its major plane or moving in a direction parallel to the Z′ axis, and means for insulatingly mounting the aforesaid means with respect to said support along an axis about which said plate has a minimum moment of inertia.

8. A piezoelectric crystal system comprising a quartz crystal plate of the AT-cut type, having X, Y and Z′ axes with its edges sensibly parallel to the X and Z′ axes and having spaced notches so positioned that a line connecting the corresponding notches on opposite edges is parallel to the Z′ axis, compressive spring means having a minimal moment of inertia establishing electrical connection with opposite faces of the quartz plate and terminating in hooks engaging the notches in the plate, flat metallic angle members having horizontally extending portions and vertically extending portions, a base of insulation material, said horizontally extending portions each projecting beneath the lower edges of said plate in directions toward the plane of the plate and being fastened to said base in spaced insulated relation and said vertically extending portions being fastened to said compressive spring means along an axis substantially coincident with the horizontal centerline of the quartz crystal plate and inhibiting normal displacement due to a bending mode.

9. A piezoelectric crystal system comprising a support of insulation material, a quartz crystal plate having spaced notches in its opposite edges, a minimal moment of inertia mounting for said plate having inhibition of normal displacement due to a bending mode comprising compressive spring means establishing compressive electrical connection with opposite faces of the quartz plate and terminating in integrally connected hooks engaging the notches in the plate, means carried by said support and connected with said spring means at points substantially in a line passing through the horizontal center line of said quartz crystal plate, and electrical terminals supported in spaced insulated relation and connected with said last mentioned means.

WALLACE H. E. SAMUELSON.

References Cited in the file of this patent

UNITED STATES PATENTS

| Number | Name | Date |
|---|---|---|
| 2,423,061 | Bach | June 24, 1947 |
| 2,443,700 | Sylvester et al. | June 22, 1948 |
| 2,481,806 | Wolfskill | Sept. 13, 1949 |
| 2,523,701 | Kuehl | Sept. 26, 1950 |